United States Patent
Chen et al.

(10) Patent No.: US 6,551,927 B1
(45) Date of Patent: Apr. 22, 2003

(54) COSI$_x$ PROCESS TO IMPROVE JUNCTION LEAKAGE

(75) Inventors: Dian-Hau Chen, Hsin-chu (TW); Kwang-Ming Lin, Hsin-chu (TW); Yu-Ku Lin, Hsin-chu (TW); Tong-Hua Kuan, Hsin-chu (TW); Jin-Kuen Lan, Hsin-chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/880,920

(22) Filed: Jun. 15, 2001

(51) Int. Cl.[7] ............................................. H01L 21/44
(52) U.S. Cl. ........................ 438/664; 438/682; 438/651
(58) Field of Search ................... 438/665, 682, 438/664, 661, 660, 651, 653

(56) References Cited

U.S. PATENT DOCUMENTS

| | | | |
|---|---|---|---|
| 5,317,187 A | * 5/1994 | Hindman et al. | 438/688 |
| 5,736,461 A | 4/1998 | Berti et al. | 438/651 |
| 5,902,129 A | * 5/1999 | Yoshikawa et al. | 438/592 |
| 5,970,370 A | 10/1999 | Besser et al. | 438/586 |
| 6,103,610 A | 8/2000 | Blair | 438/592 |
| 6,121,139 A | 9/2000 | Chang et al. | 438/683 |
| 6,136,705 A | 10/2000 | Blair | 438/682 |

* cited by examiner

Primary Examiner—Caridad Everhart
(74) Attorney, Agent, or Firm—George O. Saile; Stephen B. Ackerman; Rosemary L.S. Pike

(57) ABSTRACT

A cobalt silicide process having a titanium-rich/titanium nitride capping layer to improve junction leakage is described. Semiconductor device structures to be silicided are formed in and on a semiconductor substrate. A cobalt layer is deposited overlying the semiconductor device structures. A titanium-rich/titanium nitride capping layer is deposited overlying the cobalt layer. Thereafter, a cobalt silicide layer is formed on the semiconductor device structures. The titanium-rich/titanium nitride capping layer and an unreacted portion of the cobalt layer are removed to complete fabrication of the integrated circuit device.

24 Claims, 3 Drawing Sheets

COSI$_x$ PROCESS TO IMPROVE JUNCTION LEAKAGE

BACKGROUND OF THE INVENTION

1. Field of the Invention

The present invention relates to the fabrication of integrated circuit devices, and more particularly, to a method of improving junction leakage in a cobalt salicide process in the fabrication of integrated circuits.

2. Description of the Prior Art

In the fabrication of integrated circuit devices, silicidation processes are often used in order to obtain higher circuit performance. In silicidation, a refractory metal layer is deposited and then annealed. The underlying silicon reacts with the refractory metal layer to produce a silicide overlying the gate electrode and source and drain regions. The silicided gate and source/drain regions have lower resistance than non-silicided regions, especially in smaller geometries, and hence, higher circuit performance. Cobalt has been used in the art to form silicided device structures. Typically, a titanium nitride capping layer is deposited over the cobalt layer before silicidation to protect the CoSi$_x$ layer from oxygen contamination during RTA. Oxygen contamination causes poor resistance and poor silicide formation. So, the TiN capping layer can improve CoSi$_x$ formation quality. However, a major issue is poor CoSi$_x$ thickness uniformity. So, some devices may suffer high junction leakage. It has been reported that a capping titanium layer instead of a titanium nitride layer can improve junction leakage. However, it is hard to control titanium because it has a narrow process margin.

U.S. Pat. No. 5,970,370 to Besser et al teaches forming a titanium nitride capping layer over a cobalt layer, then evacuating the N$_2$ gas from the sputtering chamber and depositing a titanium layer over the titanium nitride layer. This mechanism is directed to chamber containment and oxide outgassing reduction, not for cobalt silicide uniformity improvement. U.S. Pat. No. 5,736,461 to Berti et al discloses a titanium nitride or titanium tungsten capping layer over cobalt. U.S. Pat. No. 6,121,139 to Chang et al teaches a titanium silicide process. A titanium layer is deposited. N$_2$ gas is added at 2 to 20% to form a titanium-rich titanium nitride layer over the titanium layer. A second pure titanium layer is deposited. An annealing forms titanium silicide. The capping layer in this patent is a very complicated sandwich layer. The process stability is hard to control. The titanium-rich titanium nitride layer's purpose is to resist silicon diffusion into the titanium to prevent bridging. This issue does not exist in the cobalt silicide process. U.S. Pat. Nos. 6,136,705 and 6,103,610, both to Blair show a titanium layer over cobalt and a titanium nitride layer over the titanium layer. The double capping layer of these patents is formed by two different processes using different process conditions and tool arrangements. Thickness uniformity can be improved by Blair's process, but resistance is still too high.

SUMMARY OF THE INVENTION

Accordingly, it is a primary object of the present invention to provide an effective and very manufacturable method for improving junction leakage performance in a cobalt salicide process in the fabrication of integrated circuits.

It is a further object of the invention to provide an improved cobalt silicide process having reduced junction leakage in the fabrication of integrated circuits.

Yet another object is to provide an improved cobalt silicide process having a titanium-rich titanium nitride/titanium nitride capping layer to improve junction leakage.

In accordance with the objects of the invention, a cobalt silicide process having a titanium-rich titanium nitride/titanium nitride capping layer to improve junction leakage is achieved. Semiconductor device structures to be silicided are formed in and on a semiconductor substrate. A cobalt layer is deposited overlying the semiconductor device structures. A titanium-rich titanium nitride/titanium nitride capping layer is deposited overlying the cobalt layer. Thereafter, a cobalt silicide layer is formed on the semiconductor device structures. The titanium-rich titanium nitride/titanium nitride capping layer and an unreacted portion of the cobalt layer are removed to complete fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
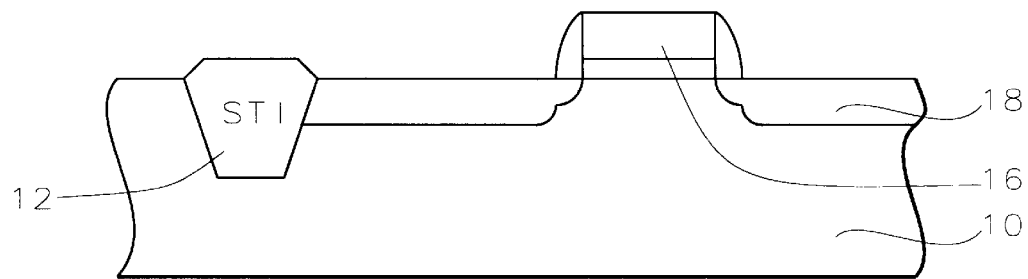
FIGS. 1 through 4 are cross-sectional representations of a preferred embodiment of the present invention.

Referring now more particularly to FIG. 1, there is shown a semiconductor substrate 10, preferably composed of monocrystalline silicon. Isolation regions are formed in and on the semiconductor substrate to separate active areas from one another. For example, local oxidation of silicon (LOCOS) or shallow trench isolation (STI) may be used. In the example illustrated, STI region 12 is formed in the semiconductor substrate. As shown in FIG. 1, semiconductor device structures, such as gate electrodes 16 and source and drain regions 18 are formed in and on the semiconductor substrate.

Figure 2:
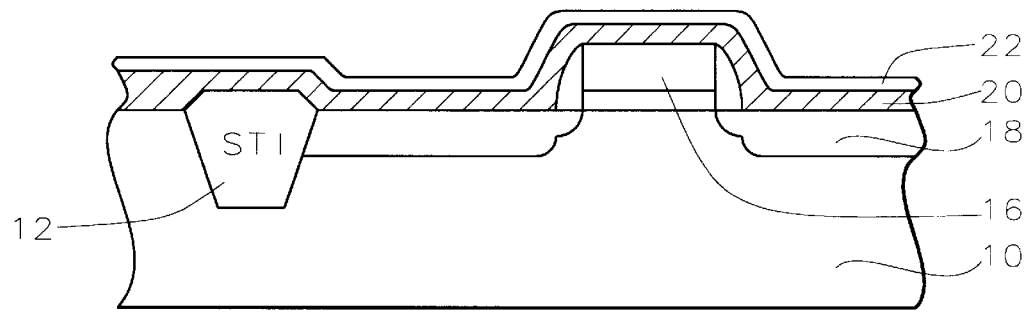

Now, the improved cobalt silicide process of the present invention will be described. First a layer of cobalt 20 is sputter deposited over the surface of the substrate to a thickness of between about 50 and 150 Angstroms, as shown in FIG. 2.

Now, the improved capping layer of the present invention will be deposited. In a deposition chamber, a titanium target is provided. An Ar sputter process is performed for 3 to 5 seconds. No nitrogen gas is present at this time. The Ar is sputtered at about 70 to 90 sccm with a power of about 6500 watts. Now, N$_2$ gas flow is turned on. Ar is sputtered at about 45 to 55 sccm and nitrogen is flowed at about 90 to 110 sccm under power of about 6500 watts for about 10 seconds. This Ar sputter process will form a titanium-rich titanium nitride layer 22 over the cobalt layer, having a thickness of between about 10 and 50 Angstroms. The layer 22 is not drawn to scale in FIG. 2.

Figure 3:
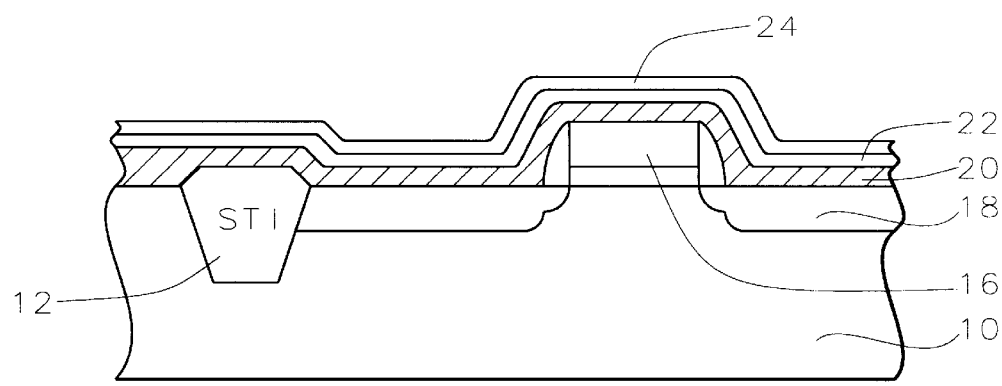

Next, a titanium nitride layer 24 is deposited overlying the titanium-rich titanium nitride layer 22, as shown in FIG. 3. Ar is sputtered at about 5 sccm along with N$_2$ flow under RF power of about 100 watts and bias power of about 300 watts. The titanium nitride layer has a thickness of between about 50 and 250 Angstroms.

The tool and process parameters are the same for both the titanium-rich titanium nitride deposition and the titanium nitride deposition. These two processes can be maintained with the same tool arrangement and choice of suitable capping layer deposition process to meet the product electrical performance requirements. If the product needs low junction leakage to save power, we can select the titanium-rich titanium nitride capping layer deposition recipe. If the product needs low resistance to improve speed, we can just select the titanium nitride capping layer deposition recipe.

Figure 4:
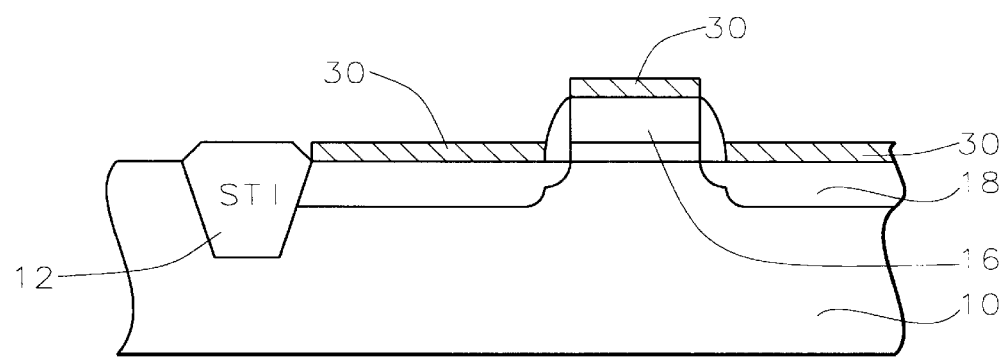

Now, the substrate is annealed, for example, by rapid thermal annealing (RTA) at 450 to 550° C. for 20 to 60 seconds. The cobalt layer overlying silicon surfaces is transformed to cobalt silicide. The capping layer 22/24 and the unreacted cobalt over the spacers and STI region is removed, leaving silicided gate electrodes and source/drain regions. A second RTA at between about 750 and 870° C. for 20 to 120 seconds improves junction leakage and resistance. Silicided regions 30 are shown in FIG. 4.

In the process of the present invention, the titanium in the titanium-rich titanium nitride layer will diffuse to the cobalt/silicon interface and form a CoSi layer by solid phase epitaxy. This improves CoSix thickness uniformity. The titanium nitride capping layer over the titanium-rich titanium nitride layer provides reduced resistance.

Figure 5:
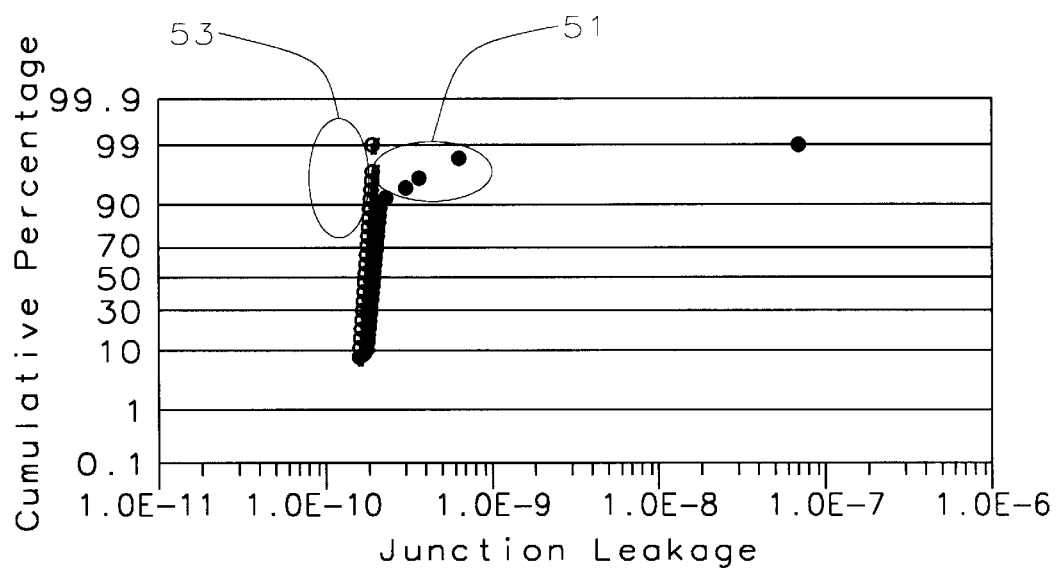
FIG. 5 is a graphical representation showing junction leakage tailing.

The process of the present invention has been implemented experimentally. FIG. 5 illustrates the junction leakage tailing. In a prior art process using a standard titanium nitride capping layer, junction leakage tailing of about 10% is shown by 51. That is, about 10% of the devices suffer high junction leakage. In the process of the present invention, no junction leakage tailing occurs, as shown by 53.

The process of the present invention provides a composite titanium-rich titanium nitride/titanium nitride capping layer over cobalt. This capping layer prevents oxygen contamination with improved cobalt silicide uniformity and improved junction leakage in a process that is easy to implement.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:
    providing device structures to be silicided in and on a substrate;
    depositing a cobalt layer overlying said device structures;
    depositing a composite titanium-rich titanium nitride/titanium nitride capping layer overlying said cobalt layer;
    thereafter forming a cobalt silicide layer on said device structures; and
    thereafter removing said composite titanium-rich titanium nitride/titanium nitride capping layer and an unreacted portion of said cobalt layer to complete fabrication of said integrated circuit device.

2. The method according to claim 1 wherein said device structures include gate electrodes and associated source and drain regions.

3. The method according to claim 1 wherein said step of depositing said composite titanium-rich titanium nitride/titanium nitride capping layer overlying said cobalt layer comprises:
    depositing a titanium-rich titanium nitride layer overlying said cobalt layer; and
    depositing a titanium nitride layer overlying said titanium-rich titanium nitride layer.

4. The method according to claim 3 wherein said step of depositing said titanium-rich titanium nitride layer comprises:
    sputtering a titanium source with an argon gas for 3 to 5 seconds; and
    thereafter sputtering a titanium source with an argon gas in conjunction with a nitrogen gas flow for about 10 seconds to form said titanium-rich titanium nitride layer.

5. The method according to claim 1 wherein said titanium-rich titanium nitride layer has a thickness of between about 10 and 50 Angstroms.

6. The method according to claim 3 wherein said step of depositing said titanium nitride layer comprises sputtering a titanium source with an argon gas in combination with a nitrogen gas to form said titanium nitride layer.

7. The method according to claim 1 wherein said titanium nitride layer has a thickness of between about 50 and 250 Angstroms.

8. The method according to claim 1 wherein said step of forming a cobalt silicide layer comprises:
    annealing said substrate whereby said cobalt layer overlying device structures is transformed to cobalt silicide and wherein said cobalt layer overlying isolation regions and dielectric spacers is unreacted.

9. The method according to claim 8 wherein said annealing is performed at between about 450 and 550° C. for 20 to 60 seconds and further comprising second annealing said substrate at between about 750 and 870° C. for 20 to 120 seconds wherein said second annealing improves junction leakage and resistance.

10. A method of fabricating an integrated circuit device comprising:
    providing device structures to be silicided in and on a substrate;
    depositing a cobalt layer overlying said device structures;
    depositing a titanium-rich titanium nitride layer overlying said cobalt layer;
    depositing a titanium nitride layer overlying said titanium-rich titanium nitride layer;
    thereafter forming a cobalt silicide layer on said device structures; and
    thereafter removing said titanium-rich titanium nitride layer, said titanium nitride layer and an unreacted portion of said cobalt layer to complete fabrication of said integrated circuit device.

11. The method according to claim 10 wherein said device structures include gate electrodes and associated source and drain regions.

12. The method according to claim 10 wherein said step of depositing said titanium-rich layer comprises:
    sputtering a titanium source with an argon gas for 3 to 5 seconds; and
    thereafter sputtering a titanium source with an argon gas in conjunction with a nitrogen gas flow for about 10 seconds to form said titanium-rich titanium nitride layer.

13. The method according to claim 10 wherein said titanium-rich titanium nitride layer has a thickness of between about 10 and 50 Angstroms.

14. The method according to claim 10 wherein said step of depositing said titanium nitride layer comprises sputtering a titanium source with an argon gas in combination with a nitrogen gas to form said titanium nitride layer.

15. The method according to claim 10 wherein said titanium nitride layer has a thickness of between about 50 and 250 Angstroms.

16. The method according to claim 10 wherein said step of forming a cobalt silicide layer comprises:

annealing said semiconductor substrate whereby said cobalt layer overlying device structures is transformed to cobalt silicide and wherein said cobalt layer overlying isolation regions and dielectric spacers is unreacted.

17. The method according to claim 16 wherein said annealing is performed at between about 450 and 550° C. for 20 to 60 seconds and further comprising second annealing said substrate at between about 750 and 870° C. for 20 to 120 seconds wherein said second annealing improves junction leakage and resistance.

18. A method of fabricating an integrated circuit device comprising:

providing device structures to be silicided in and on a substrate;

depositing a cobalt layer overlying said device structures;

depositing a titanium-rich titanium nitride layer overlying said cobalt layer wherein said titanium-rich titanium nitride layer has a thickness of no more than 50 Angstroms and wherein said depositing comprises sputtering a titanium source with an argon gas for 3 to 5 seconds and thereafter sputtering said titanium source with said argon gas in conjunction with a nitrogen gas flow for about 10 seconds to form said titanium-rich titanium nitride layer;

depositing a titanium nitride layer overlying said titanium-rich titanium nitride layer;

thereafter forming a cobalt silicide layer on said device structures; and thereafter removing said titanium-rich titanium nitride layer, said titanium nitride layer and an unreacted portion of said cobalt layer to complete fabrication of said integrated circuit device.

19. The method according to claim 18 wherein said device structures include gate electrodes and associated source and drain regions.

20. The method according to claim 18 wherein said titanium-rich titanium nitride layer has a thickness of between about 10 and 50 Angstroms.

21. The method according to claim 18 wherein said step of depositing said titanium nitride layer comprises sputtering a titanium source with an argon gas in combination with a nitrogen gas to form said titanium nitride layer.

22. The method according to claim 18 wherein said titanium nitride layer has a thickness of between about 50 and 250 Angstroms.

23. The method according to claim 18 wherein said step of forming a cobalt silicide layer comprises:

annealing said semiconductor substrate whereby said cobalt layer overlying device structures is transformed to cobalt silicide and wherein said cobalt layer overlying isolation regions and dielectric spacers is unreacted.

24. The method according to claim 23, wherein said annealing is performed at between about 450 and 550° C. for 20 to 60 seconds and further comprising second annealing said substrate at between about 750 and 870° C. for 20 to 120 seconds wherein said second annealing improves junction leak resistance.

* * * * *